(12) United States Patent
Chan et al.

(10) Patent No.: US 6,190,497 B1
(45) Date of Patent: Feb. 20, 2001

(54) ULTRASONIC TRANSDUCER

(75) Inventors: Helen Lai Wa Chan; Siu Wing Or; Kei Chun Cheng; Chung Loong Choy, all of Kowloon (HK)

(73) Assignee: The Hong Kong Polytechnic University, Kowloon (HK)

( * ) Notice: Under 35 U.S.C. 154(b), the term of this patent shall be extended for 0 days.

(21) Appl. No.: 09/296,801

(22) Filed: Apr. 23, 1999

(51) Int. Cl.[7] .............................. B32B 31/16; B23K 1/06; B06B 1/06; H01L 41/04
(52) U.S. Cl. ..................... 156/580.1; 228/1.1; 228/4.5; 310/325; 310/369
(58) Field of Search ................ 156/580.1, 580.2; 228/110.1, 1.1, 4.5; 310/323.12, 325, 334, 357, 358, 366, 369

(56) References Cited

U.S. PATENT DOCUMENTS

| | | |
|---|---|---|
| 3,595,069 | 7/1971 | Fowler . |
| 4,040,885 | 8/1977 | Hight et al. . |
| 4,683,396 * | 7/1987 | Takeuchi et al. ................. 310/358 |
| 4,854,494 | 8/1989 | von Raben . |
| 4,858,470 | 8/1989 | Kincaid et al. . |
| 5,314,105 | 5/1994 | Farassat . |
| 5,357,423 | 10/1994 | Weaver et al. . |
| 5,377,894 | 1/1995 | Mizoguchi et al. . |
| 5,540,807 | 7/1996 | Akiike et al. . |
| 5,748,566 | 5/1998 | Goodson . |

* cited by examiner

*Primary Examiner*—Michael W. Ball
*Assistant Examiner*—Michael A Tolin
(74) *Attorney, Agent, or Firm*—Leydig, Voit & Mayer, Ltd.

(57) ABSTRACT

A bonding tool for applying pressure and ultrasonic energy simultaneously to join miniature components together includes an ultrasonic driver having four composite wafers separated by electrodes. Such bonding tools are known that use wafers made of wholly of ceramic material. By using wafers having four sector parts of ceramic material separated by layers of polymer as shown, bonding tools are provided with broader bandwidth operation and reduced spurious resonance modes.

5 Claims, 4 Drawing Sheets

18

19

20

ULTRASONIC TRANSDUCER

BACKGROUND OF THE INVENTION

1. Field of the Invention

The invention relates to ultrasonic transducers.

2. Description of Prior Art

The invention relates more particularly to such transducers for use in bonding tools for connecting semiconductors to printed circuit boards, for example. The bonding tools are used to apply pressure and ultrasonic energy simultaneously to miniature components. At present the materials used in the driver of the ultrasonic transducers are piezoelectric ceramics. The ceramic transducers have sharp resonances and high "Q". Within the narrow bandwidth of operation, coupling of different resonance modes causes a loss of energy to unwanted modes of vibration and reduces the efficiency as well as the stability of the transducer.

SUMMARY OF THE INVENTION

It is an object of the invention to overcome or at least reduce this problem. According to the invention there is provided a bonding tool for applying pressure and ultrasonic energy simultaneously to join miniature components together comprising an ultrasonic driver having a plurality of thin piezoelectric wafers held under mechanical pressure against each other, in which at least one of the wafers is ceramic/polymer composite having two or more ceramic parts that are separated from one another by a layer of polymer material extending in a plane parallel to a minor axis in the thickness direction of the wafer.

The ceramic/polymer composite wafer has a central longitudinal axis parallel to its minor axis and polymer material separating layers may extend in planes that are radial to the longitudinal axis. At least some of the polymer material separating layers may extend in planes transverse to the longitudinal axis.

The wafers are preferably cylindrical.

The bonding tool preferably has four ceramic/polymer composite wafers.

BRIEF DESCRIPTION OF THE DRAWING

A bonding tool according to the invention will now be described by way of example with reference to the accompanying drawings in which.

DESCRIPTION OF THE PREFERRED EMBODIMENTS

Figure 1:
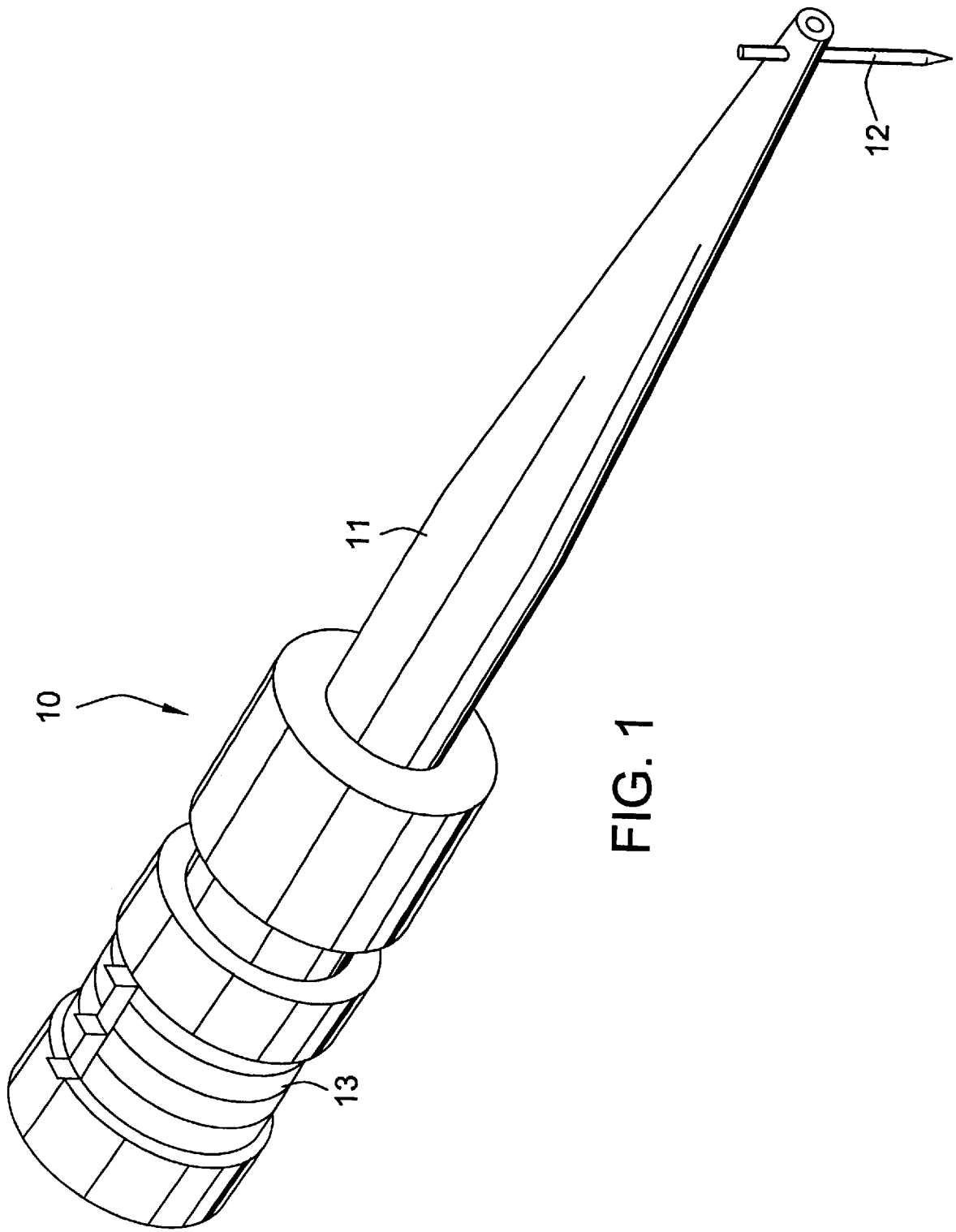
FIG. 1 is an isometric view of a known bonding tool.
Figure 2:
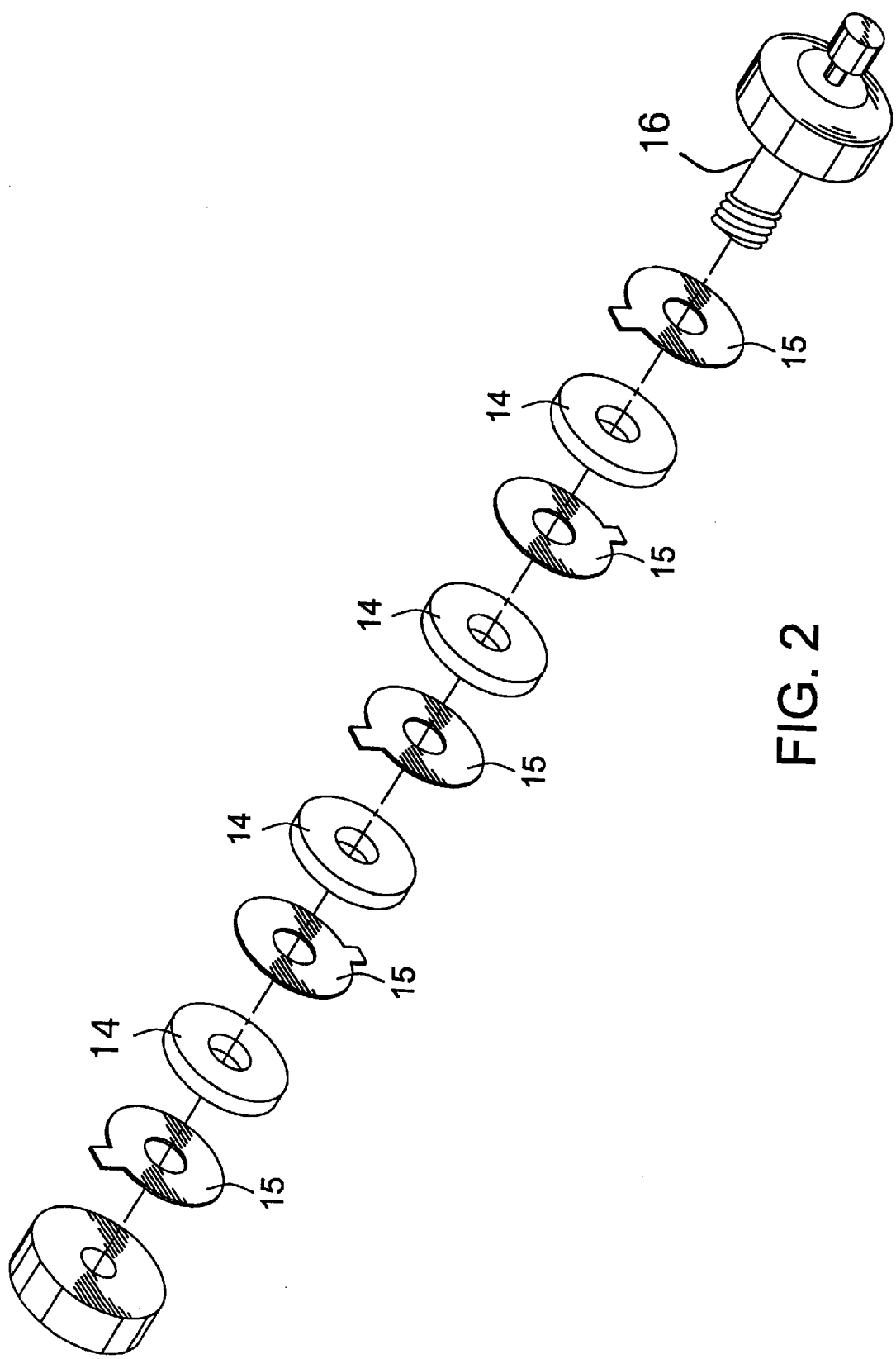
FIG. 2 is an exploded view of an ultrasonic driver for the bonding tool of FIG. 1.

Referring to the drawings, in FIGS. 1 and 2 the known bonding tool comprises a barrel 10 and an elongate horn 11. A sharply pointed wedge 12, attached adjacent a remote end of the horn 11, is used in practice to direct pressure and ultrasonic energy to miniature components that are to be mechanically joined together. An ultrasonic driver 13 includes four cylindrical ceramic wafers 14 separated by disk electrodes 15 to which an electric alternating current power supply can be connected. The wafers 14 are held on a threaded shaft 16 (see FIG. 2) and against one another by a nut (not shown). The nut is tightened in practice such that the wafers 14 always remain in compression during operation of the tool.

The tool so far described is well-known and has been widely used in practice. It has certain drawbacks that have already been referred to in this specification. Such drawbacks are restricting its satisfactory operation especially for use with smaller components that could benefit from applying high frequencies, up to say 125 KHz, whereas typically 62 KHz is used at present, and exhibiting greater stability.

Figure 3:
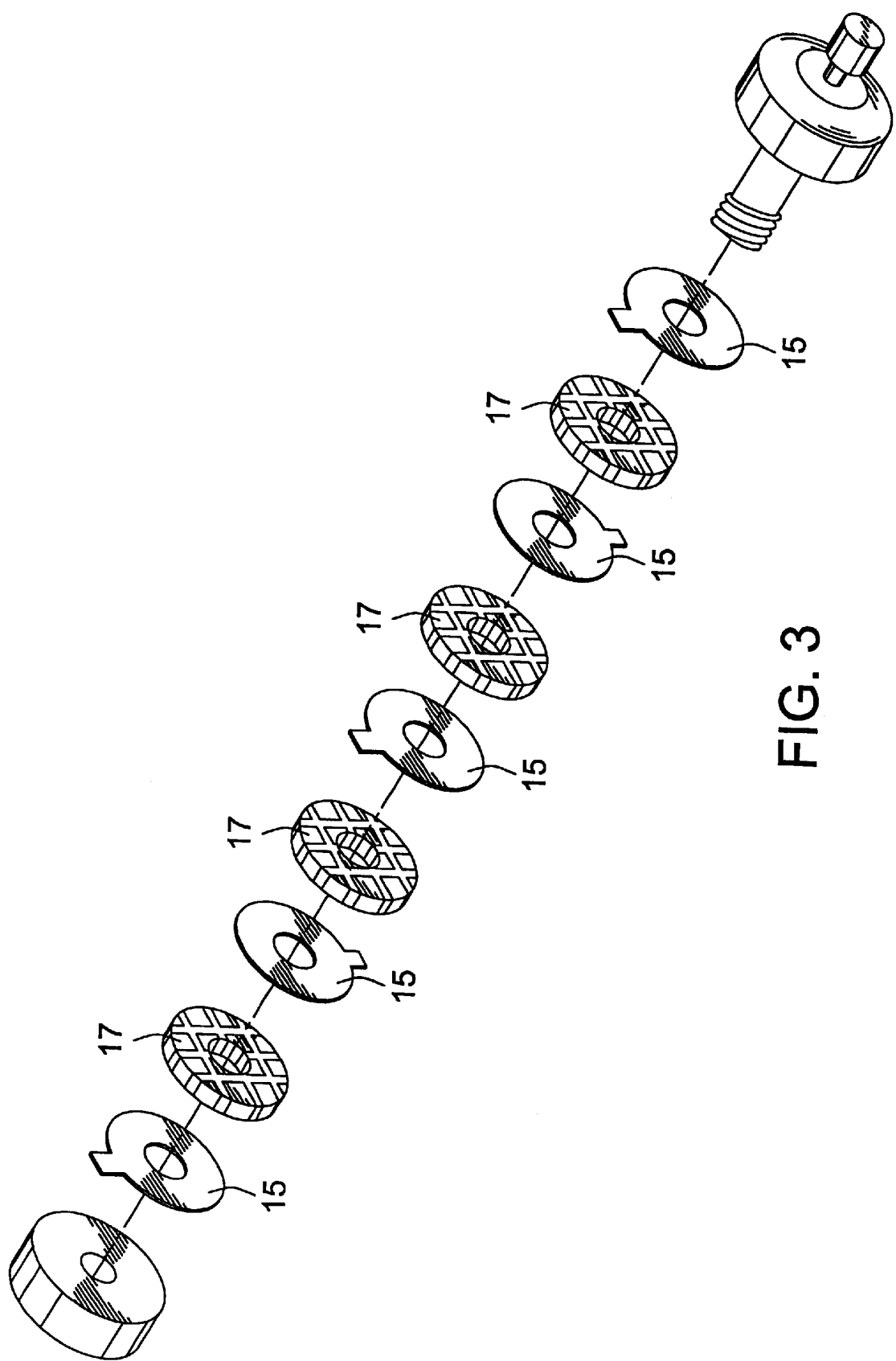
FIG. 3 is an exploded view of an ultrasonic driver of a bonding tool according to the invention.

In FIG. 3, an ultrasonic driver for a bonding tool according to the present invention has four ceramic/ polymer composite wafers 17 that replace the wafers 14 (of FIG. 2). otherwise the ultrasonic driver is the same as shown in FIG. 2. It will be seen that each composite wafer is made up of a number of parts of ceramic material that are separated from one another by layers of polymer material. These thin layers of polymer extend in planes that are parallel to the minor axes or a longitudinal central axis of each wafer 17 and suppress vibrations in unwanted modes. The planes for the layers of each wafer are aligned with like planes in adjacent wafers. A suitable polymer is made up of LW5157 resin and HY5159 hardener, available from Ciba Specialty Chemicals Limited.

The use of composite wafers broadens the bandwidth of operation of the bonding tool and greatly reduces spurious resonance modes experienced with the prior art bonding tool. The driver of FIG. 3 has a clean resonance mode at an operational frequency while other modes are inherently suppressed in practice. The electrical Q of the bonding tool of FIG. 1 is usually around 990 whereas the Q of the driver of FIG. 3 can be much lower, about 200. Hence, the frequency locking of the transducer of FIG. 3 is less critical, enhasing the stability of operation. A bonding transducer incorporating composite wafers as described exhibits a clean and wider bandwidth resonance mode at an operational frequency, thus minimising mode coupling and providing improved transducer stability.

Figure 4:
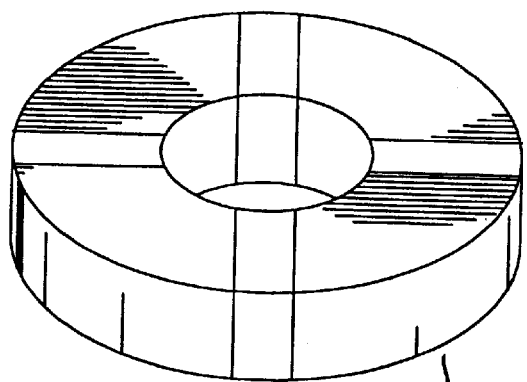
FIG. 4 is another form of a ceramic/polymer composite wafer for the bonding tool of FIG. 3.
Figure 5:
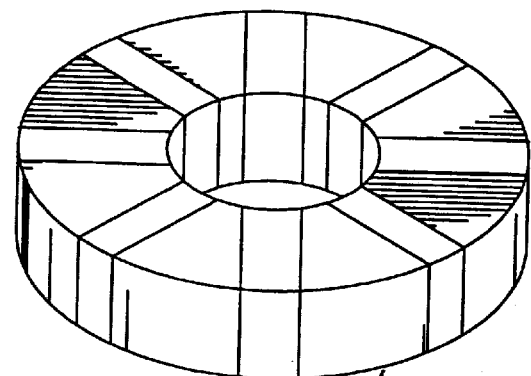
FIG. 5 is a further form of a ceramic/polymer wafer for the bonding tool of FIG. 3.
Figure 6:
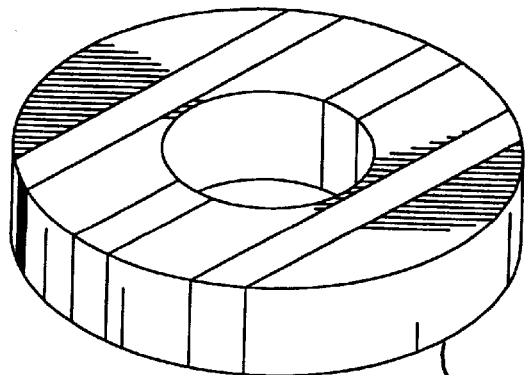
FIG. 6 is a yet further form of a ceramic/polymer wafer for the bonding tool of FIG. 3.

In FIG. 4, another form of composite wafer 18 is shown. In this Figure, thin layers of polymer extend in planes, radially from a central axis of the wafer 18 separating the ceramic into four equal sectors. FIG. 5 shows wafers 19 where a composite wafer 19 is separated into eight equal sector parts by the layers of polymer. In FIG. 6, a composite wafer 20 is similar to the wafers 14 (of FIG. 3) except there are only four separate ceramic parts instead of sixteen parts as in the wafers 14.

Ultrasonic drivers for bonding tools according to the invention can. be made up of combinations of the composite wafers shown in and described with respect to in FIGS. 3, 4, 5 and 6. Additionally, the composite wafers may be used in combination with "conventional" wafers 14 that are shown in FIG. 1. In all cases certain improvements are thereby provided to enhance the use and operation of the ultrasonic bonding tools so formed.

Whereas all the described composite wafers are cylindrical, embodiments of the invention can be provided with other shapes of composite wafers, including irregular and rectangular cross-section composite wafers. In each case, the polymer layers are used to hold the ceramic parts together and to suppress vibrations in unwanted (or un-usable) modes of vibration.

We claim:

1. A bonding tool for applying pressure and ultrasonic energy simultaneously to join miniature components together comprising an ultrasonic driver having a plurality of thin piezoelectric wafers held under mechanical pressure against each other, in which at least one of the wafers is a ceramic/polymer composite having at least two ceramic parts that are separated from one another by a layer of polymer material extending in a plane parallel to the thickness direction of the wafer.

2. The bonding tool according to claim 1, in which the ceramic/polymer composite wafer has a central longitudinal axis, and a polymer material extending in a plane radial to the longitudinal axis.

3. The bonding tool according to claim 1, in which the ceramic/polyner composite wafer has a central longitudinal axis and polymer material extending in a plane transverse to the longitudinal axis.

4. The bonding tool according to claim 1, in which the wafers are cylindrical.

5. The bonding tool according to claim 1, having four peramic/polymer composite wafers.

* * * * *

UNITED STATES PATENT AND TRADEMARK OFFICE
CERTIFICATE OF CORRECTION

PATENT NO.    : 6,190,497B1
DATED         : February 20, 2001
INVENTOR(S)   : Chan et al.

It is certified that error appears in the above-identified patent and that said Letters Patent is hereby corrected as shown below:

Claim 5,
Line 2, change "peramic/polymer" to -- ceramic/polymer --.

Signed and Sealed this

Thirty-first Day of July, 2001

Attest:

NICHOLAS P. GODICI
Attesting Officer    Acting Director of the United States Patent and Trademark Office